US007219280B2

(12) United States Patent
McNall

(10) Patent No.: US 7,219,280 B2
(45) Date of Patent: May 15, 2007

(54) INTEGRATED CIRCUIT WITH TEST SIGNAL ROUTING MODULE

(75) Inventor: Walter Lee McNall, Mendian, ID (US)

(73) Assignee: Avago Technologies General IP (singapore) Pte. Ltd., Singapore (SG)

( * ) Notice: Subject to any disclaimer, the term of this patent is extended or adjusted under 35 U.S.C. 154(b) by 434 days.

(21) Appl. No.: 10/373,388

(22) Filed: Feb. 24, 2003

(65) Prior Publication Data

US 2004/0177294 A1    Sep. 9, 2004

(51) Int. Cl.
*G01R 31/28* (2006.01)
(52) U.S. Cl. .................. 714/726; 714/727; 714/729
(58) Field of Classification Search ........... 714/724, 714/725, 726, 727, 729, 742
See application file for complete search history.

(56) References Cited

U.S. PATENT DOCUMENTS

| 4,872,169 | A | * | 10/1989 | Whetsel, Jr. ............... 714/727 |
| 5,377,197 | A |   | 12/1994 | Patel et al. |
| 5,592,493 | A | * | 1/1997  | Crouch et al. ............. 714/729 |
| 5,610,926 | A |   | 3/1997  | Marris |
| 5,809,039 | A |   | 9/1998  | Takahashi et al. |
| 5,894,213 | A | * | 4/1999  | Nakamura ............... 340/146.2 |
| RE36,292  | E |   | 9/1999  | Scarra et al. |
| 6,028,983 | A | * | 2/2000  | Jaber ........................... 714/30 |
| 6,178,534 | B1| * | 1/2001  | Day et al. .................. 714/745 |
| 6,242,269 | B1| * | 6/2001  | Whetsel ....................... 438/11 |
| 6,327,683 | B1|   | 12/2001 | MacCormack |
| 6,327,687 | B1|   | 12/2001 | Rajski et al. |
| 6,380,780 | B1|   | 4/2002  | Aitken et al. |
| 6,430,718 | B1| * | 8/2002  | Nayak ........................ 714/727 |
| 6,557,129 | B1| * | 4/2003  | Rajski et al. ............... 714/729 |
| 6,560,734 | B1| * | 5/2003  | Whetsel ...................... 714/724 |
| 6,665,828 | B1| * | 12/2003 | Arimilli et al. ............. 714/726 |
| 6,701,476 | B2| * | 3/2004  | Pouya et al. ................ 714/727 |
| 6,941,498 | B2| * | 9/2005  | Hartano et al. ............. 714/729 |
| 2002/0147950 | A1 | * | 10/2002 | Whetsel ..................... 714/726 |
| 2002/0184582 | A1 |   | 12/2002 | Pouya et al. |
| 2002/0194565 | A1 | * | 12/2002 | Arabi ......................... 714/729 |
| 2003/0229834 | A1 | * | 12/2003 | Cooke ........................ 714/726 |

* cited by examiner

*Primary Examiner*—Albert Decady
*Assistant Examiner*—John P Trimmings

(57) ABSTRACT

Embodiments of the present invention provide an integrated circuit. In one embodiment, the integrated circuit comprises logic blocks and a routing module. The routing module is configured to receive test input vectors, select at least one logic block, select a routing configuration, and route the test input vectors to the at least one selected logic block and provide test output vectors according to the selected routing configuration.

17 Claims, 5 Drawing Sheets

INTEGRATED CIRCUIT WITH TEST SIGNAL ROUTING MODULE

THE FIELD OF THE INVENTION

The present invention relates generally to integrated circuits, and more particularly to testing integrated circuits.

BACKGROUND OF THE INVENTION

An integrated circuit, referred to as a very large scale integrated (VLSI) circuit, includes a large number of circuit elements as part of a single device. A VLSI device, referred to as an application specific integrated circuit (ASIC), is configured to operate in a single application. An ASIC can be built as a circuit with multiple, independent functions and as a system-on-a-chip, which contains a core processor, memory, and peripheral logic elements all on the same substrate. Testing a VLSI device can be difficult due to the complexity of the device and limited access to internal nodes provided by external device pins.

In one test configuration, a device is tested functionally. Functional testing is accomplished by driving device inputs with test vectors and checking device outputs for responses. In the case of combinational logic, a set of test vectors can be defined to exercise all possible logic states. In the case of a device having storage elements, the task can be significantly more complex. For a device having storage elements, test vectors can be developed to clock the storage elements to known states. However, deriving a substantially exhaustive set of functional test vectors can become a design exercise rivaling the design of the device itself. In this case, developing functional test vectors can represent a significant development cost.

To simplify the task of deriving test vectors, design for test (DFT) philosophies have developed to make a device more testable without recourse to functional test vectors. In one such philosophy, referred to as scan testing, all storage elements within a device operate in a normal mode and a test mode. In the normal mode, the device operates to perform application functions. In the test mode, the storage elements are configured into scan chains capable of receiving control signals to act like a shift register. The device can then be regarded as relatively simple combinational logic between shift register stages. The combinational logic provides inputs to the storage elements, and the storage elements provide inputs to the combinational logic. A test input is provided at one end of each scan chain to load the shift register, and a test output is provided at the other end of each scan chain to unload the shift register. After loading the scan chains in the test mode, the device is switched to the normal mode and clocked. Next, the scan chains are unloaded in the test mode to check responses. The combinational logic and storage elements can be tested without regard to the overall functionality of the device.

Scan testing simplifies the task of deriving test vectors for the device. However, scan chains through a large device can become excessively long, resulting in clock skew problems from one edge of the device to the other. Also, the number of test vectors for ample fault coverage can become excessive. Long scan chains and large test vector sets result in long test times, which increase the cost of the device. The device costs can be prohibitive for low production quantities and the ASIC market.

SUMMARY OF THE INVENTION

Embodiments of the present invention provide an integrated circuit. In one embodiment, the integrated circuit comprises logic blocks and a routing module. The routing module is configured to receive test input vectors, select at least one logic block, select a routing configuration, and route the test input vectors to the at least one selected logic block and provide test output vectors according to the selected routing configuration.

DESCRIPTION OF THE PREFERRED EMBODIMENTS

In the following detailed description of the preferred embodiments, reference is made to the accompanying drawings, which form a part hereof, and in which is shown by way of illustration specific embodiments in which the invention may be practiced. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
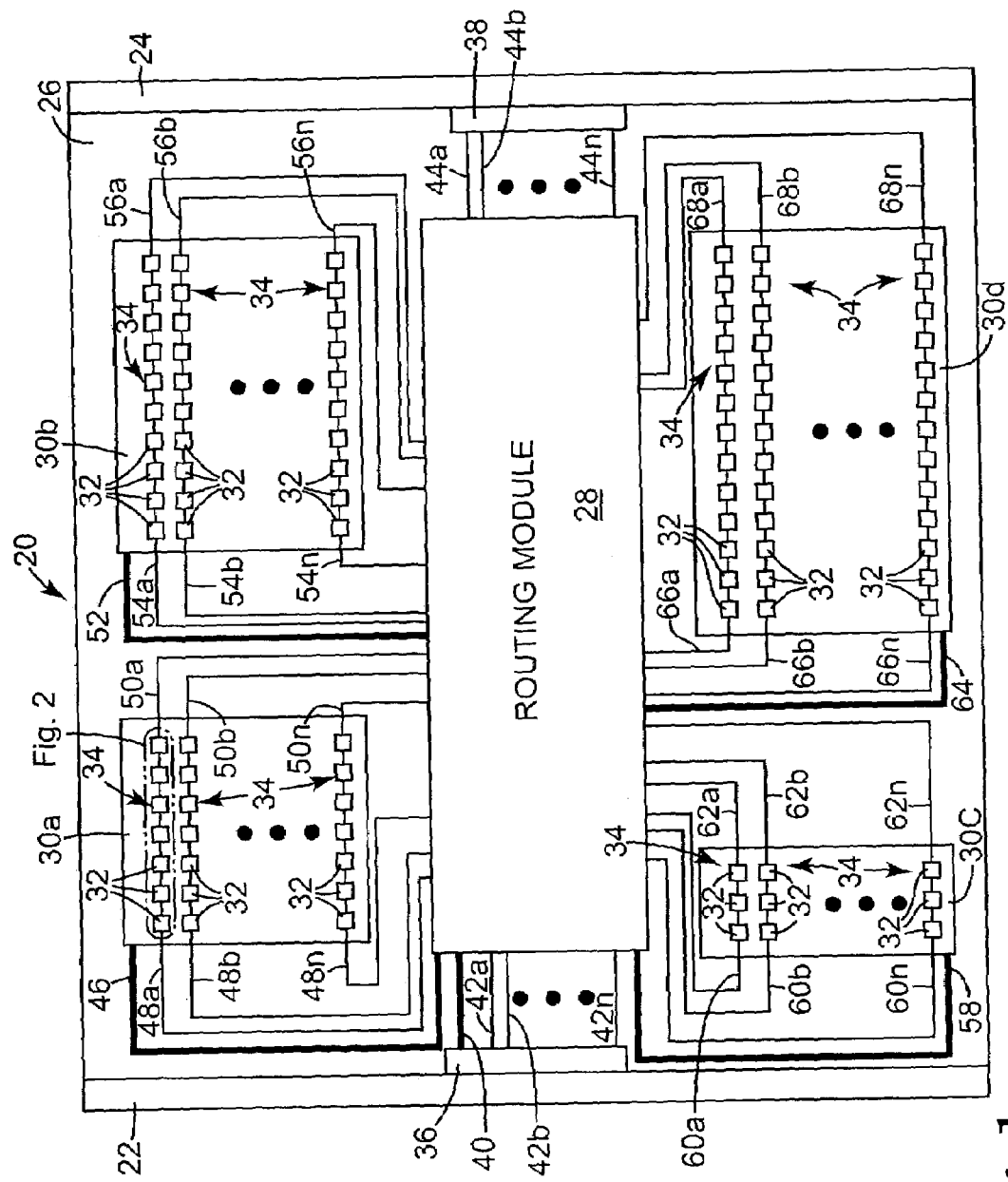
FIG. 1 is a diagram illustrating an exemplary embodiment of an integrated circuit, according to the present invention.

FIG. 1 is a diagram illustrating an exemplary embodiment of an integrated circuit 20, according to the present invention. The integrated circuit 20 is a VLSI device designed to operate in a specific application, i.e., an ASIC. In the exemplary embodiment, the integrated circuit 20 includes a system-on-a-chip and multiple, independent functions. In other embodiments, the integrated circuit 20 can include a system-on-a-chip or, in the alternative, multiple, independent functions.

In the exemplary embodiment, the integrated circuit 20 includes input circuits 22, output circuits 24 and internal circuitry, indicated at 26. The input circuits 22 and output circuits 24 are electrically coupled to the internal circuitry 26 and external pins, which electrically couple the integrated circuit 20 to a system. The internal circuitry 26 performs test functions and the normal application functions of the integrated circuit 20.

To perform the test functions, the internal circuitry 26 includes a routing module 28 and is divided into four logic blocks, indicated at 30a–30d. The internal circuitry 26 can be divided into logic blocks 30a–30d by function or by other criteria, such as location on the integrated circuit 20. In the exemplary embodiment, only a small number of logic blocks 30a–30d are shown to simplify the current explanation. In practice, the integrated circuit 20 is any suitable size and divided into any suitable number of logic blocks.

The routing module 28 receives test signals from the input circuits 22, and routes the test signals to the logic blocks 30a–30d. These test signals are test input signals including test control and clocking signals, referred to as test control signals, and test input vectors. The routing module 28 routes the test input signals to the logic blocks 30a–30d, and receives test output signals from the logic blocks 30a–30d. The routing module 28 selects a routing configuration to test the logic blocks 30a–30d individually, as a series of logic blocks 30a–30d or as a parallel set of logic blocks 30a–30d. Dividing the integrated circuit 20 into logic blocks 30a–30d results in shorter scan chains. Testing the logic blocks 30a–30d in series or parallel reduces the number of test vectors needed for ample fault coverage. Shorter scan chains and reducing the number of test vectors reduces the test time and cost of the integrated circuit 20.

To accomplish these savings, the internal circuitry 26 is configured to operate in a normal mode and a test mode. In the normal mode, combinational logic and storage elements 32 in the logic blocks 30a–30d are electrically coupled to perform the application functions of the integrated circuit 20 in the system. In this mode, combinational logic and storage elements 32 of a logic block 30a–30d are electrically coupled to combinational logic and storage elements 32 in the same and/or different logic blocks 30a–30d. In the test mode, storage elements 32 are electrically coupled to form shift registers, referred to as scan chains, indicated at 34. Each logic block 30a–30d includes multiple, independent scan chains 34. The test inputs and test outputs of the scan chains 34 are electrically coupled to routing module 28. The mode of operation can be set in a number of ways including holding an external pin high or low, or setting bits in an internal control register.

The input circuits 22 are electrically coupled to input logic 36, and the output circuits 24 are electrically coupled to output logic 38. In the test mode, the input logic 36 directs test input signals to the routing module 28 from the input circuits 22, and the output logic 38 directs test output signals from the routing module 28 to the output circuits 24. In the exemplary embodiment, only some of the input circuits 22 and output circuits 24 are used for testing the integrated circuit 20. In other embodiments, all or any combination of input circuits 22 and output circuits 24 can be used for testing the integrated circuit 20. The input circuits 22 and output circuits 24 used for testing the integrated circuit 20 serve a dual purpose, as they are also used for normal operation.

Routing module 28 is electrically coupled to the input logic 36 and output logic 38. Test input control bus 40 and test vector input lines 42a–42n electrically couple the input logic 36 to the routing module 28. Test vector output lines 44a–44n electrically couple the routing module 28 to the output logic 38. In the test mode, test signals are passed to the routing module 28 through the test input control bus 40 and test vector input lines 42a–42n from the input circuits 22 and input logic 36. Test signals are passed from the routing module 28 through the test vector output lines 44a–44n to the output logic 38 and output circuits 24.

The routing module 28 is electrically coupled to each of the logic blocks 30a–30d. Logic block 30a is electrically coupled to the routing module 28 by test input control bus 46 and test vector input lines 48a–48n. Test vector input lines 48a–48n are electrically coupled to corresponding test inputs of scan chains 34 in logic block 30a. The test outputs of the scan chains 34 from logic block 30a are electrically coupled to corresponding test vector output lines 50a–50n, which are electrically coupled to routing module 28. Logic block 30b is electrically coupled to the routing module 28 by test input control bus 52 and test vector input lines 54a–54n. Test vector input lines 54a–54n are electrically coupled to the test inputs of corresponding scan chains 34 in logic block 30b. The test outputs of the scan chains 34 are electrically coupled to the routing module 28 by corresponding test vector output lines 56a–56n. Logic block 30c is electrically coupled to routing module 28 by test input control bus 58 and test vector input lines 60a–60n. Test vector input lines 60a–60n are electrically coupled to the test inputs of corresponding scan chains 34 in logic block 30c. The test outputs of the scan chains 34 are electrically coupled to the routing module 28 by corresponding test vector output lines 62a–62n. Logic block 30d is electrically coupled to routing module 28 by test input control bus 64 and test vector input lines 66a–66n, which are electrically coupled to test inputs of corresponding scan chains 34 in logic block 30d. The test outputs of the scan chains 34 in logic block 30d are electrically coupled to the routing module 28 by corresponding test vector output lines 68a–68n.

In the test mode, routing module 28 receives test input signals supplied to the routing module 28 through the input circuits 22 and input logic 36. Test control signals are supplied through the test input control bus 40, and test input vectors are supplied through the test vector input lines 42a–42n. Some of the test control signals configure or set the routing module 28 to direct other test control signals and test input vectors to a selected logic block 30a–30d or a selected set of logic blocks 30a–30d. In the exemplary embodiment, the routing module 28 selects one of two routing configurations to route test control signals and test input vectors to one individual logic block 30a–30d or a series of logic blocks 30a–30d. In other embodiments, the routing module 28 can be configured to select any suitable number of routing configurations. Where the logic blocks 30a–30d can be coupled and selected in any suitable order.

With the routing module 28 set to route test input signals to a selected logic block 30a–30d, the test output signals or vectors from the selected logic block 30a–30d are routed to output circuits 24 by the routing module 28. The test output vectors are supplied to the output circuits 24 through test vector output lines 44a–44n and output logic 38. The test output vectors are checked against expected values to verify proper operation of the combinational logic and storage elements 32 in the selected logic block 30a–30d.

With the routing module 28 set to route test input signals to a series of logic blocks 30a–30d, the test control signals are routed to all logic blocks 30a–30d in the series, and the test input vectors are routed to the first logic block 30a–30d in the series. In the exemplary embodiment, the series of logic blocks 30a–30d includes logic block 30a as the first in the series and logic block 30d as the last in the series. Test vector input lines 42a–42n are electrically coupled to test vector input lines 48a–48n of logic block 30a by routing module 28. Test vector output lines 50a–50n of logic block 30a are electrically coupled to test vector input lines 54a–54n of logic block 30b by routing module 28. Test vector output lines 56a–56n of logic block 30b are electrically coupled to test vector input lines 60a–60n of logic block 30c by routing module 28. Test vector output lines 62a–62n are electrically coupled to test vector input lines 66a–66n of logic block 30d by routing module 28. Test vector output lines 68a–68n from the last logic block 30d in the series are routed to output circuits 24 through test vector output lines 44a–44n and output logic 38 by routing module 28. The routing module 28 routes the test input vectors through logic block 30a to all other logic blocks 30b–30d. Routing module 28 routes test output vectors from logic block 30d to output circuits 24 through test vector output lines 44a–44n and output logic 38.

In operation, the integrated circuit is put into the test mode and the routing module 28 is configured to route test control signals to the selected logic block(s) 30a–30d. The test input vectors are clocked into the selected logic block(s) 30a–30d corresponding scan chains 34. Clocking the test input vectors into the logic block(s) 30a–30d sets up initial conditions for normal operation of the integrated circuit 20. The integrated circuit 20 is then switched to the normal mode and the storage elements 32 are clocked in normal operation to store values from normal operation of the combinational logic and storage elements 32. The integrated circuit 20 is then switched to the test mode and the data gathered from normal operation is clocked out of the shift register scan chains 34 and through the routing module 28 to the output circuits 24. The test output vectors are checked against expected results to verify operation of the combinational logic and storage elements 32. This testing is done without regard to the functionality of the logic blocks 30a–30d and the overall functionality of the integrated circuit 20.

In another embodiment of the routing module, the integrated circuit is put into the test mode and the routing module is configured to select a third routing configuration to route the test control signals and test input vectors to logic blocks 30a–30d in parallel. Each logic block 30a–30d is sent the same set of test input vectors. Next, the integrated circuit 20 is switched to normal mode and clocked in normal operation. The integrated circuit is then switched to test mode and the test output vectors are clocked out of the logic blocks 30a–30d to routing module 28, which combines the test output vectors from the logic blocks 30a–30d in parallel to provide test output vectors from the parallel combination. In one embodiment, the test output vectors from logic blocks 30a–30d are combined in parallel through an EXCLUSIVE-OR circuit to produce EXCLUSIVE-OR test output vectors. The routing module 28 provides the EXCLUSIVE-OR test output vectors through the test vector output lines 44a–44n and output logic 38 to the output circuits 24. In this embodiment, the routing module can also be configured to route test input signals to a selected individual logic block 30a–30d or a series of logic blocks 30a–30d, as previously described.

Figure 2:
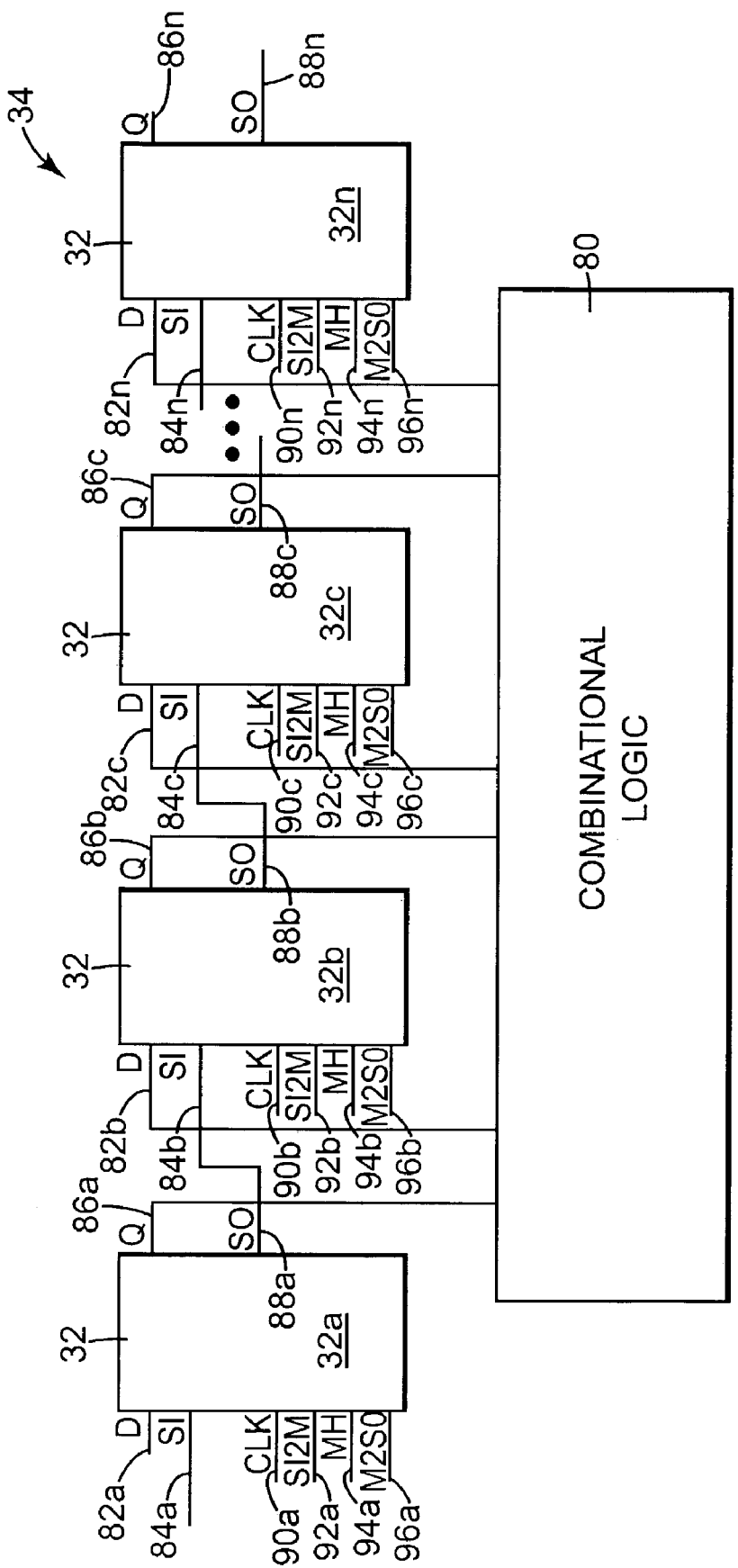
FIG. 2 is a diagram illustrating a scan chain and combinational logic from a logic block.

FIG. 2 is a diagram illustrating a scan chain 34 and combinational logic 80 from logic block 30a. The scan chain 34 is similar to all other scan chains 34 in integrated circuit 20 and includes storage elements, indicated at 32. In normal mode, the storage elements 32 are electrically coupled to the combinational logic 80 to perform application functions of the integrated circuit 20. In test mode, the storage elements 32 are electrically coupled to one another in series to form a shift register. The number of storage elements 32 in a scan chain 34 can be different from one scan chain 34 to another. Also, the number of scan chains 34 in a logic block 30a–30d can be different from one logic block 30a–30d to another.

Scan chain 34 includes D flip flop storage elements 32a–32n arranged to form a shift register. Each storage element 32a–32n is also electrically coupled to combinational logic 80. Storage element 32a includes a data input 82a, a scan input 84a, a data output 86a and a scan output 88a. Storage element 32b includes a data input 82b, a scan input 84b, a data output 86b and a scan output 88b. Storage element 32c includes a data input 82c, a scan input 84c, a data output 86c and a scan output 88c. This continues, up to storage element 32n, which includes a data input 82n, a scan input 84n, a data output 86n and a scan output 88n. In other words, each storage element 32a–32n includes a data input 82a–82n, a scan input 84a–84n, a data output 86a–86n and a scan output 88a–88n. Storage elements 32a–32n also include a clock input 90a–90n, a scan into master input 92a–92n, a master hold input 94a–94n and a master to scan output input 96a–96n.

In the exemplary embodiment, storage element 32a includes data input 82a electrically coupled to combinational logic of another logic block 30b–30d. In another embodiment, data input 82a can be unattached and storage element 32a can be inserted in the scan chain 34 for providing an initial condition to combinational logic 80. Scan input 84a is electrically coupled to scan vector input line 48a. Data output 86a is electrically coupled to combinational logic 80 in logic block 30a. Scan output 88a is electrically coupled to the scan input 84b of storage element 32b. Clock input 90a is electrically coupled to a system clock in the integrated circuit 20 for normal operation. The scan in to master input 92a and the master hold input 94a are electrically coupled to test input control bus 46 and routing module 28. The master to scan output input 96a is electrically coupled to a system master to scan output signal in integrated circuit 20.

Storage element 32b includes scan input 84b electrically coupled to scan output 88a of storage element 32a. Data input 82b is electrically coupled to combinational logic 80 in logic block 30a. Data output 86b is electrically coupled to combinational logic 80, and scan output 88b is electrically coupled to scan input 84c of storage element 32c. The clock input 90b is electrically coupled to a system clock for normal operation and the master to scan output input 96b is electrically coupled to a system master to scan output signal for test mode operation. Scan in to master input 92b and master hold input 94b are electrically coupled to test input control bus 46 and routing module 28.

Storage element 32c is electrically coupled to storage element 32b, where scan input 84c is electrically coupled to scan output 88b of storage element 32b. Data input 82c and data output 86c are electrically coupled to combinational logic 80 in logic block 30a. The scan output 88c is electrically coupled to the next storage element 32 in scan chain 34. Clock input 90c is electrically coupled to a system clock for normal operation and master to scan output input 96c is electrically coupled to a system master to scan output signal for test mode operation. Scan in to master input 92c and master hold input 94c are electrically coupled to test input control bus 46 and routing module 28. Other storage elements 32 in scan chain 34 are similarly connected up to storage element 32n.

Storage element 32n is the last storage element 32 in scan chain 34 and is electrically coupled to the previous storage element 32 in scan chain 34 at scan input 84n. Data input 82n is electrically coupled to combinational logic 80 and data output 86n is electrically coupled to another logic block 30b–30d. In another embodiment, data output 86n can be unattached and storage element 32n can be used for only observing nodes in combinational logic 80. Further, storage elements 32 can be inserted in any logic block 30a–30d to be part of a scan chain 34 for setting up initial conditions in the logic block 30a–30d or observing nodes in the combinational logic of the logic block 30a–30d. The scan output 88n of storage element 32n in logic block 30a is electrically coupled to test vector output line 50a and routing module 28.

The storage elements 32a–32n are D flip flop type elements including a master latch and a slave latch. In normal operation, data at the data inputs 82a–82n is latched into the master latch by switching clock inputs 90a–90n low. The data is transferred from the master latch to the slave latch by raising the clock inputs 90a–90n high. Data on the slave latch is provided at the data outputs 86a–86n and scan outputs 88a–88n. The scan into master inputs 92a–92n and the master to scan output inputs 96a–96n are held low during normal operation to disable the scan in inputs 84a–84n and to prevent transferring data from the master latch to the scan outputs 88a–88n without using the system clock signal. The master hold inputs 94a–94n are held low to enable the D inputs 82a–82n.

In test mode operation, data at the scan inputs 84a–84n is latched into the data outputs 86a–86n and scan outputs 88a–88n. The master hold inputs 94a–94n are held high to disable the D inputs 82a–82n of storage elements 32a–32n. The clock inputs 90a–90n are held low to prevent data on the master latch from moving to the data outputs 86a–86n and scan outputs 88a–88n. The scan into master inputs 92a–92n are raised high to latch data from the scan inputs 84a–84n into the master latch. The master to scan output inputs 96a–96n are raised high to latch data from the master latch into the slave latch, which provides the data to the data outputs 86a–86n and scan outputs 88a–88n. In another embodiment, the master to scan output inputs 96a–96n are held low and not used. Instead, the clock inputs 90a–90n are raised high to latch data from the master latch into the slave latch, which provides the data to the data outputs 86a–86n and scan outputs 88a–88n.

In the exemplary embodiment, in the test mode, the scan chain 34 acts like a shift register to move scan input data from the scan inputs 84a–84n to the scan outputs 88a–88n and the data outputs 86a–86n. The scan chain 34 is used as a shift register to move scan data into the scan chain 34 to set up initial conditions on the storage elements 32a–32n and combinational logic 80. The scan chain 34 is also used as a shift register to shift data out of the scan chain 34 for checking the data against expected values for testing storage elements 32a–32n and combinational logic 80. Storage elements 32a–32n of this type are described in U.S. Pat. No. 6,380,780, entitled "Integrated Circuit With Scan Flip-Flop," issued to Aitken et al., on Apr. 20, 2002, which is herein incorporated by reference. In other embodiments, the storage elements 32a–32n can be other types of storage elements.

For testing, the integrated circuit 20 is switched into the test mode and a test input vector is supplied to scan input 84a of storage element 32a. The scan into master inputs 92a–92n and master to scan output inputs 96a–96n are toggled, alternatively, to shift the test input vector into scan chain 34. After the test input vector is shifted into the scan chain 34, the integrated circuit 20 is switched into the normal mode of operation. At this point, initial conditions are present on data outputs 86a–86n and combinational logic 80, which provides data to data inputs 82a–82n of storage elements 32a–32n. Clock inputs 90a–90n are toggled low and high to move data from data inputs 82a–82n to data outputs 86a–86n and scan outputs 88a–88n. The data on the data outputs 86a–86an and scan outputs 88a–88n is test output vector information gathered from the combinational logic 80 and storage elements 32a–32n. For the test output vector to equal expected values, the storage elements 32a–32n and combinational logic 80 must function properly. Next, the integrated circuit 20 is switched into the test mode and the test output vector is shifted out of the shift register scan chain 34. The test output vector is checked against expected values to verify proper operation of the combinational logic 80 and storage elements 32. As the test output vector is shifted out of the scan chain 34 a new test input vector is loaded into the scan chain 34. The process is continued until test vectors are exhausted.

Figure 3:
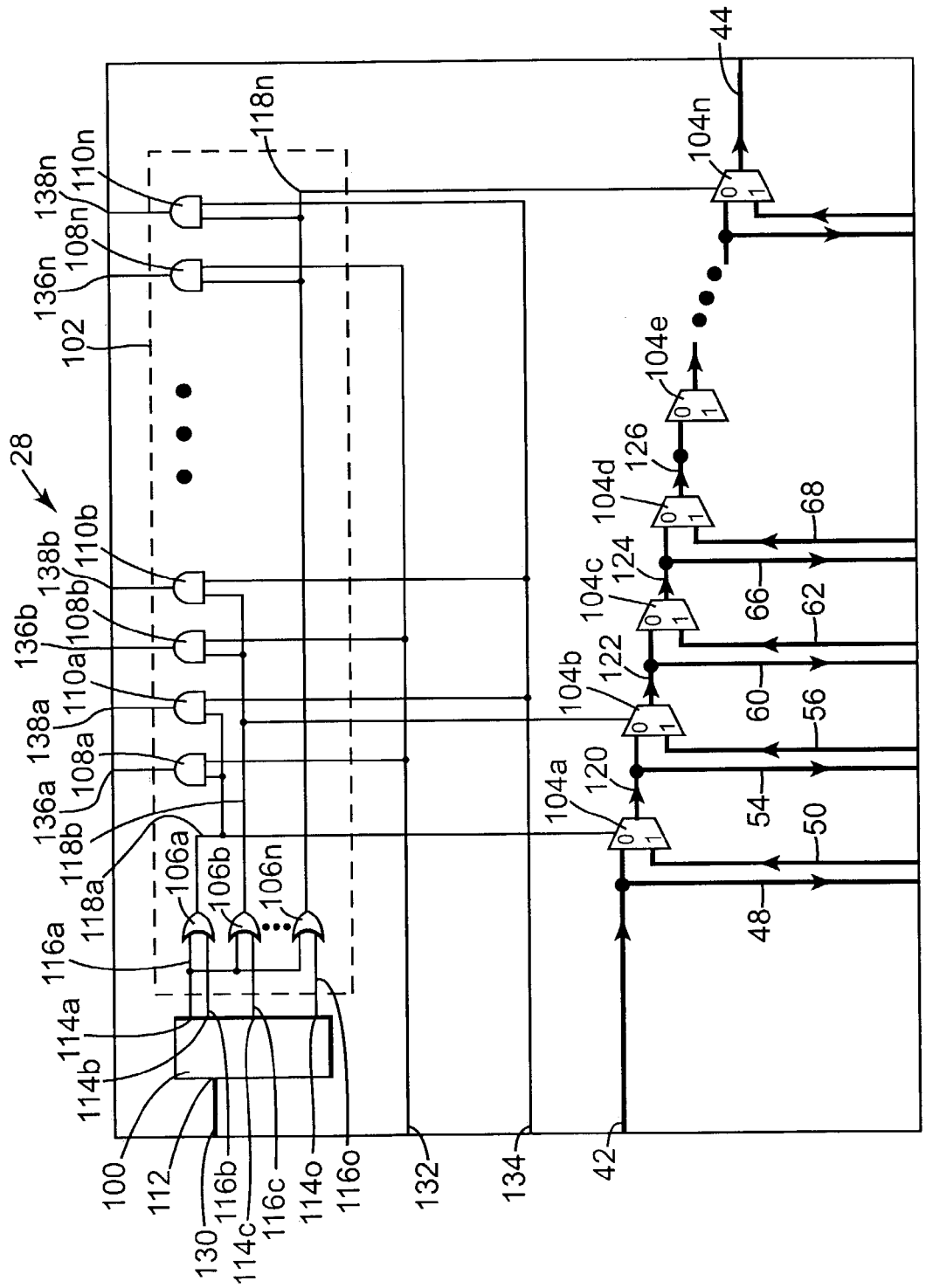
FIG. 3 is a diagram illustrating an exemplary embodiment of the routing module.

FIG. 3 is a diagram illustrating an exemplary embodiment of the routing module 28. Routing module 28 includes a decoder 100, selection logic 102 and multiplexer sets 104a–104n. Selection logic 102 includes two-input OR gates 106a–106n and two sets of two-input AND gates 108a–108n and 110a–110n. The routing module 28 can accommodate up to n logic blocks, such as logic blocks 30a–30d in integrated circuit 20. In one embodiment, the decoder 100 is a 4 to 16 decoder. In other embodiments, the decoder 100 can be any suitable size, such as a 3 to 8 decoder, a 4 to 16 decoder or larger.

The decoder 100 includes decoder inputs 112 and decoder outputs 114a–114o. The decoder inputs 112 receive a binary input and the decoder 100 decodes the binary input to select one decoder output 114a–114o. The selected output 114a–114o is switched or held high. In the exemplary embodiment, the decoder 100 is a 4 to 16 decoder, where 4 decoder inputs 112 accommodate up to 16 binary numbers. Each of the 16 binary numbers selects one decoder output 114a–114o. The decoder output 114a corresponds to a binary input of zero. The decoder output 114b corresponds to a binary input of one, and the decoder output 114c corresponds to a binary input of two. The binary inputs select decoder outputs 114a–114o, one at a time, up to and including decoder output 114o.

Decoder 100 is electrically coupled to selection logic 102 and OR gates 106a–106n. Decoder output 114a is electrically coupled to all OR gates 106a–106n through decoder output line or conductor 116a. Decoder output 114b is electrically coupled to OR gate 106a by decoder output conductor 116b. Decoder output 114c is electrically coupled to OR gate 106b by decoder output conductor 116c. In other words, decoder outputs 114b–114o are electrically coupled to OR gates 106a–106n by corresponding decoder output conductors 116b–116o.

The outputs of OR gates 106a–106n are electrically coupled to the two sets of AND gates 108a–108n and 110a–110n, and multiplexer sets 104a–104n. The output of OR gate 106a is electrically coupled to an input of AND gate 108a, an input of AND gate 110a and the select inputs of multiplexer set 104a through OR gate output conductor 118a. The output of OR gate 106b is electrically coupled to an input of AND gate 108b, an input of AND gate 110b and the select inputs of mutliplexer set 104b through OR gate output conductor 118b. The remaining OR gates 106c–106n are electrically coupled to inputs of AND gates 108c–108n, inputs of AND gates 110c–110n and select inputs of multiplexer sets 104c–104n through OR gate output conductors 118c–118n.

The multiplexer sets 104a–104n include multiple two to one multiplexers in parallel for routing test input and output vectors through routing module 28. Each multiplexer in a multiplexer set 104a–104n is electrically coupled to a test vector input line and a test vector output line. In the exemplary embodiment, a test vector input line is electrically coupled to the zero input and a test vector output line is electrically coupled to the one input. All select inputs of the multiplexers in a multiplexer set 104a–104n are electrically coupled together, such that either all test vector input lines are selected or all test vector output lines are selected in a multiplexer set 104a–104n.

Test vector input bus 42 includes test vector input lines 42a–42n. Each test vector input line 42a–42n is electrically coupled to a separate two to one multiplexer in multiplexer set 104a. In the exemplary embodiment, each test vector input line 42a–42n is electrically coupled to the zero input of a corresponding multiplexer in multiplexer set 104a. Test vector input bus 42 is also electrically coupled to test vector input bus 48. Test vector input bus 48 includes test vector input lines 48a–48n, which are electrically coupled to test vector input lines 42a–42n, respectively, and the inputs of scan chains 34 in logic block 30a. Test vector output bus 50 includes test vector output lines 50a–50n, which are electrically coupled to the outputs of scan chains 34 in logic block 30a and the one inputs of multiplexers in multiplexer set 104a.

The multiplexers in multiplexer set 104a are electrically coupled to test vector input bus 42 at the zero inputs and test vector output bus 50 at the one inputs. The bus lines are arranged so test vector input line 42a and test vector output line 50a are attached to the same multiplexer. Test vector input line 42b and test vector output line 50b are attached to the same multiplexer and so on, until test vector input line 42n and test vector output line 50n are attached to the same and last multiplexer in multiplexer set 104a. All select inputs of the multiplexers in multiplexer 104a are coupled to OR gate output conductor 118a and OR gate 106a. With select inputs of multiplexer set 104a held at zero, the test vector input bus 42 is selected. With select inputs held at one, the test vector output bus 50 from logic block 30a is selected. The selected bus, test vector input bus 42 or test vector output bus 50, is provided from the multiplexers in multiplexer set 104a to multiplexer output bus 120. The multiplexer output bus 120 includes multiplexer output lines 120a–120n, which correspond to test vector input lines 42a–42n or test vector output lines 50a–50n. All multiplexer sets 104a–104n include multiple 2 to 1 multiplexers and operate in the same way as multiplexer set 104a.

Multiplexer output bus 120 is electrically coupled to the zero inputs of the multiplexers in multiplexer set 104b and to test vector input bus 54. Test vector input bus 54 includes test vector input lines 54a–54n, which are electrically coupled to the inputs of scan chains 34 in logic block 30b. Test vector output bus 56 includes test vector output lines 56a–56n, which are electrically coupled to the outputs of scan chains 34 in logic block 30b and the one inputs of the multiplexers in multiplexer set 104b. The output of OR gate 106b is electrically coupled to the select inputs of the multiplexers in multiplexer set 104b, which provide the selected input to multiplexer output bus 122.

Multiplexer output bus 122 electrically couples the outputs of multiplexer set 104b to the zero inputs of multiplexer set 104c. Multiplexer output bus 122 is also electrically coupled to test vector input bus 60, which includes test vector input lines 60a–60n electrically coupled to the scan inputs of scan chains 34 in logic block 30c. Test vector output bus 62 includes test vector output lines 62a–62n, which are electrically coupled to the one inputs of multiplexer set 104c and scan outputs from scan chains 34 in logic block 30c. Multiplexer set 104c provides multiplexer output bus 124, which is electrically coupled to the zero inputs in multiplexer set 104d and to test vector input bus 66. Test vector input bus 66 includes test vector input lines 66a–66n, which are electrically coupled to the scan inputs of scan chains 34 in logic block 30d. The scan outputs from scan chains 34 in logic block 30d are electrically coupled to the one inputs of multiplexer set 104d through test vector output bus 68, which includes test vector output lines 68a–68n.

In the exemplary embodiment, the integrated circuit 20 includes four logic blocks 30a–30d. These logic blocks 30a–30d are accessed through multiplexer sets 104a–104d. Multiplexer sets 104e–104n are not needed in this exemplary embodiment. However, multiplexer sets 104e–104n illustrate that the exemplary embodiment can be expanded to accommodate any suitable number of logic blocks, such as logic blocks 30a–30d. Since multiplexer sets 104e–104n are not used, the select inputs are held at zero. In practice, the multiplexer sets 104e–104n and accompanying circuitry could be removed from the routing module 28. Multiplexer output bus 126 is electrically coupled to the zero inputs of multiplexer set 104e, and so on with each subsequent multiplexer set 104f–104n, up to and including multiplexer set 104n. Multiplexer set 104n provides outputs to test vector output bus 44, which includes test vector output lines 44a–44n. Test vector output lines 44a–44n are electrically coupled to the output logic 38 and output circuits 24.

Test input configuration bus 130 is electrically coupled to decoder inputs 112 and input logic 36. The test input configuration bus 130 is part of test input control bus 40, which electrically couples the routing module 28 to the input logic 36 and input circuits 22. Test configuration data in the form of binary inputs are provided to the decoder 100 through test input configuration bus 130. The decoder 100 selects one decoder output 114a–114o, which sets an input high on one or more OR gates 106a–106n.

The OR gates 106a–106n drive the select inputs of multiplexer sets 104a–104n and inputs on selected AND gates 108a–108n and 110a–110n. In the exemplary embodiment, each multiplexer set 104a–104d is electrically coupled to one logic block 30a–30d. Multiplexer set 104a is electrically coupled to logic block 30a, multiplexer set 104b is electrically coupled to logic block 30b, multiplexer set 104c is electrically coupled to logic block 30c and multiplexer set 104d is electrically coupled to logic block 30d. The AND gates 108a–108n and 110a–110n gate control signals to logic blocks 30a–30d.

Test input control bus 40 includes a scan into master control line 132 and a master hold control line 134. The scan into master control line 132 is electrically coupled to one input of each AND gate 108a–108n. The master hold control line 134 is electrically coupled to one input of each AND gate 110a–110n. The AND gates 108a–108n gate the scan into master control signal provided over the scan into master control line 132 to selected logic block(s) 130a–130d. The AND gates 110a–110n gate the master hold control signal provided through the master hold control line 134 to the selected logic block(s) 30a–30d.

The AND gates 108a–108n and 110a–110n, gate the scan into master control signal and master hold control signal to scan chains 34 in the selected logic block(s). The AND gates 108a–108n and 110a–110n disable or switch off the scan into master control signal and master hold control signal to non-selected logic blocks. Switching off scan chain shifting in non-selected logic blocks reduces power consumption and noise levels during scan testing. Reducing noise levels, increases voltage margins during scan testing. This makes it easier to scan test the integrated circuit 20 at low voltage source values.

The AND gates 108a–108n have output signals 136a–136n and the AND gates 110a–110n have output signals 138a–138n. The outputs 136a and 138a are part of test input control bus 46, which electrically couples the routing module 28 to logic block 30a. The AND gate outputs 136b and 138b are part of test input control bus 52, which electrically couples the routing module 28 to logic block 30b. The AND gate output pair 136c and 138c are part of test input control bus 58, which electrically couples the routing module 28 to logic block 30c. The AND gate output pair 136d and 138d are part of test input control bus 64, which electrically couples the routing module 28 to logic block 30d.

Routing module 28 is configured to select one logic block 30a–30d or a series of logic blocks 30a–30d for testing. To test one logic block 30a–30d, the integrated circuit 20 is set to test mode and a binary one or greater is provided to decoder inputs 112 through test input configuration bus 130. Decoder 100 responds by selecting one decoder output 114b–114o, which provides a high input to one OR gate 106a–106n. The output of the selected OR gate provides a high logic level to the select inputs of one multiplexer set 104a–104n and a pair of AND gates 108a–108n and 110a–108n. The selected pair of AND gates 108a–108n and 110a–108n couple the scan into master control line 132 and the master hold control line 134 to the selected logic block 30a–30d. In the exemplary embodiment only logic blocks 30a–30d can be selected.

Next, a test input vector is provided to routing module 28 through input circuits 22, input logic 36 and test vector input bus 42. The test input vector propagates through the zero inputs of non-selected multiplexer sets 104a–104d until reaching the selected multiplexer set 104a–104d. The test input vector is provided to the selected logic block 30a–30d through a test vector input bus 48, 54, 60 or 66.

The scan into master control signal is provided through the scan into master control line 132 and the master hold control signal is provided through the master hold control line 134. These signals are provided to the selected logic block 30a–30d through the selected pair of AND gates 108a–108n and 110a–110n. The scan into master control signal and the master hold control signal operate to shift the test input vector into the scan chains 34 in the selected logic block 30a–30d. After the test input vector has been shifted into the selected logic block 30a–30d, the integrated circuit 20 is switched to normal mode.

In normal mode, the system clock is toggled to acquire data from the storage elements 32 and combinational logic in the selected logic block 30a–30d. The storage elements 32 can be clocked one or more times to acquire the data. After clocking the system clock in normal operation, the integrated circuit 20 is switched back to test mode.

In test mode, the outputs of scan chains 34 in the selected logic block 30a–30d are provided to the selected multiplexer set 104a–104d through a test vector output bus 50, 56, 62 or 68. The selected multiplexer set 104a–104d routes the test output vector from the selected logic block 30a–30d to the test vector output bus 44. The scan into master control signal and the master hold control signal are provided to the selected logic block 30a–30d through the selected AND gate pair 108a–108n and 110a–110n to shift the test output vector through the scan chains 34 and out of the integrated circuit 20. The test output vectors are provided to the output logic 38 and output circuits 24 through the test vector output bus 44. The test output vector is checked against expected values to determine if storage elements 32 and combinational logic in the selected logic block 30a–30d are functioning properly. As the test output vector is shifted out of the scan chains 34, a new test input vector is shifted into the scan chains 34 in the selected logic block 30a–30d. The process continues until the selected logic block 30a–30d has been tested with all provided test vectors. Testing logic blocks individually reduces the length of scan chains 34 and the test vectors, and fault coverage usually ranges from 70% to 90%. To reduce the number of test vectors and increase fault coverage, routing module 28 provides a second way of testing the integrated circuit 20.

To test a series of logic blocks 30a–30d, a binary zero is provided to decoder inputs 112 through test input configuration bus 130. In response, decoder 100 selects decoder output 114a, which provides a high logic level to an input of each OR gate 106a–106n. The OR gates 106a–106n provide a high logic level to the select inputs of all multiplexer sets 104a–104d and one inputs of each AND gate 108a–108n and 110a–108n. The AND gates 108a–108n and 110a–110n gate the scan into master control signal and master hold control signal to all logic blocks 30a–30d.

Next, test input vectors are provided to routing module 28 through input circuits 22, input logic 36 and test vector input bus 42. With all select inputs of multiplexer sets 104a–104d high, the test input vectors are routed through the test vector input bus 42 and test vector input bus 48 to logic block 30a. The outputs from logic block 30a are provided through test vector output bus 50 and multiplexer set 104a to test vector input bus 54 for logic block 30b. In other words, the outputs from logic block 30a are provided as inputs to the logic block 30b. The outputs from logic block 30b are provided through test vector output bus 56 and multiplexer set 104b to test vector input bus 60 of logic block 30c, which couples the outputs from logic block 30b to the inputs of logic block 30c. The outputs from logic block 30c are provided through the test vector output bus 62 and multiplexer set 104c to test vector input bus 66 and logic block 30d, which couples the outputs from logic block 30c to the inputs of logic block 30d. The outputs from logic block 30d are provided through test vector output bus 68 and multiplexer set 104d to multiplexer sets 104e through 104n to test vector output bus 44.

In test mode, a test input vector is shifted into logic blocks 30a–30d by toggling the scan into master control signal and the master to scan out signal. The test input vector is shifted through logic block 30a to logic block 30b, logic block 30c and logic block 30d. After logic blocks 30a–30d have been loaded with the test input vector, the integrated circuit 20 is switched to normal mode.

In normal mode, the system clock is toggled to operate the integrated circuit in normal operation. The system clock can by toggled once or more than once to acquire data. After toggling the system clock, the integrated circuit 20 is switched back to test mode.

In test mode, the scan into master signal and master to scan output signal are toggled to shift the test output vector through the integrated circuit 20. The test output vector is shifted out of the logic blocks 30a–30d through multiplexer sets 104a–104d to test vector output bus 44 and output circuits 24. The test output vector is checked against expected values to determine if the storage elements 32 and combinational logic in logic blocks 30a–30d are functioning properly. As the test output vector is shifted out, a new test input vector is shifted into the scan chains 34 in logic blocks 30a–30d. The process continues until all provided test vectors are exhausted. Testing a series of logic blocks 30a–30d verifies operation between logic blocks 30a–30d and reduces the number of test vectors needed for testing the integrated circuit 20, which reduces the cost of the integrated circuit 20.

Figure 4:
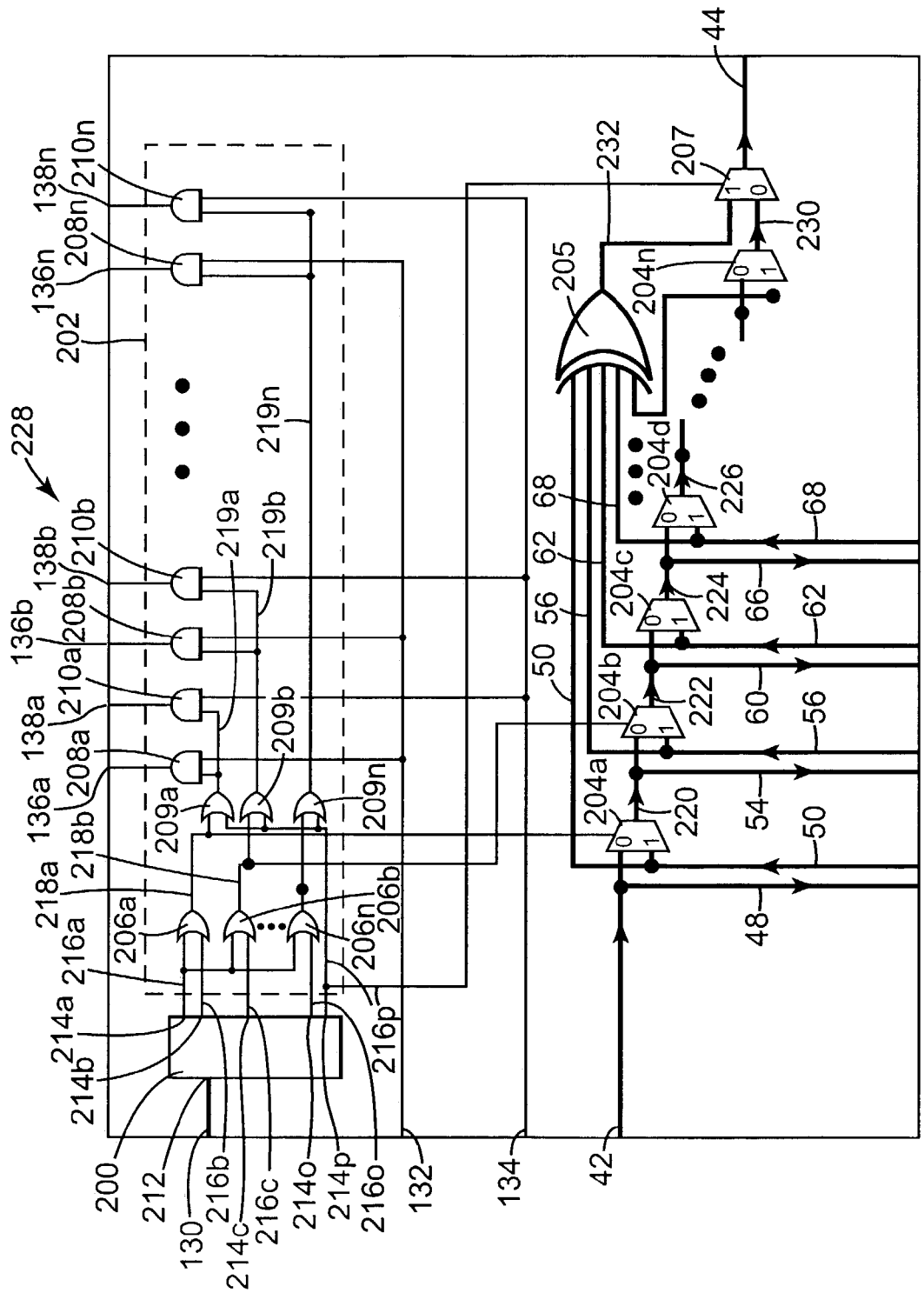
FIG. 4 is a diagram illustrating another embodiment of a routing module for use in an integrated circuit.

FIG. 4 is a diagram illustrating another embodiment of a routing module 228 for use in integrated circuit 20. Routing module 228 includes a decoder 200, selection logic 202, multiplexer sets 204a–204n, EXCLUSIVE-OR gate set 205 and an output multiplexer set 207. The selection logic 202 includes a first set of OR gates 206a–206n, a second set of OR gates 209a–209n, a first set of AND gates 208a–208n and a second set of AND gates 210a–210n. The routing module 228 can accommodate up to n logic blocks, such as logic blocks 30a–30d in integrated circuit 20.

Decoder 200 includes decoder inputs 212 and decoder outputs 214a–214p. In one embodiment, decoder 200 is a 4 to 16 decoder. In other embodiments decoder 200 is any suitable size, such as a 3 to 8 decoder, a 4 to 16 decoder or larger.

The decoder inputs 212 are electrically coupled to input logic 36 through the test input configuration bus 130. Test input configuration bus 130 is part of test input control bus 40, which electrically couples the routing module 28 to input logic 36. Decoder outputs 214a–214o are electrically coupled to decoder output conductors or lines 216a–216o, respectively, which are electrically coupled to the first set of OR gates 206a–206n. Decoder output 214p is electrically coupled to an input of each second set OR gate 209a–209n and also the select inputs of output multiplexer set 207 through decoder output line 216p.

Decoder output 214a is electrically coupled to decoder output line 216a, which is electrically coupled to an input of each first set OR gate 206a–206n. A second input of each first set OR gate 206a–206n is electrically coupled to another decoder output 214b–214o. Decoder output 214b is electrically coupled to first set OR gate 206a over decoder output line 216b. Decoder output 214c is electrically coupled to first set OR gate 206b through decoder output line 216c and so on, up to decoder output 214o, which is electrically coupled to first set OR gate 206n through decoder output line 216o.

The first set OR gates 206a–206n are electrically coupled to corresponding second set OR gates 209a–209n, and also to corresponding multiplexer sets 204a–204n. First set OR gate 206a is electrically coupled to an input of second set OR gate 209a and to the select inputs of multiplexer set 204a through select output line 218a. First set OR gate 206b is electrically coupled to an input of second set OR gate 209b and select inputs of multiplexer set 204b through select output line 218b and so on, up to first set OR gate 206n, which is electrically coupled to an input of second set OR gate 209n and the select inputs of multiplexer set 204n through select output line 218n.

The second set OR gates 209a–209n are each electrically coupled to one first set AND gate 208a–208n and one second set AND gate 210a–210n. Second set OR gate 209a is electrically coupled at its output to an input of first set AND gate 208a and an input of second set AND gate 210a through gating output line 219a. Second set OR gate 209b is electrically coupled to an input of first set AND gate 208b and an input of second set AND gate 210b over gating output line 219b and so on, up to second set OR gate 209n, which is electrically coupled to an input of first set AND gate 208n and an input of second set AND gate 210n through gating output line 219n.

The first set of AND gates 208a–208n and the second set of AND gates 210a–210n direct or gate control signals through the routing module 228 to logic blocks 30a–30d. The first set AND gates 208a–208n each include an input electrically coupled to scan into master control line 132. The second set AND gates 210a–210n each include an input electrically coupled to the master hold control line 134. In this embodiment, the test input control bus 40 is made up of the scan into master control line 132, the master hold control line 134 and the test input configuration bus 130. The test input control bus 40 electrically couples the routing module 228 to the input logic 36 and input circuits 22.

The first set of AND gates 208a–208n are electrically coupled to logic blocks, such as logic blocks 30a–30d, by scan into master output lines 136a–136n. The second set of AND gates 210a–210n are electrically coupled to logic blocks, such as logic blocks 30a–30d, by master hold output lines 138a–138n. The first set of AND gates 208a–208n and the second set of AND gates 210a–210n are arranged in pairs to provide control signals to logic blocks 30a–30d.

The AND gates 208a–208n and 210a–210n, gate the scan into master control signal and master hold control signal to scan chains 34 in the selected logic blocks(s). The AND gates 208a–208n and 210a–210n disable or switch off the scan into master control signal and master hold control signal to non-selected logic blocks. Disabling the shifting of non-selected logic blocks, reduces power consumption and noise levels during scan testing. Reducing noise levels, increases voltage margins during scan testing, which makes it easier to scan test the integrated circuit 20 at low voltage source levels.

First set AND gate 208a and second set AND gate 210a are electrically coupled to logic block 30a by scan into master output line 136a and master hold output line 138a. In this embodiment, scan into master output line 136a and master hold output line 138a are part of and make up test input control bus 46. Routing module 228 and logic block 30a are electrically coupled through test input control bus 46. First set AND gate 208b and second set AND gate 210b are electrically coupled to logic block 30b by scan into master output line 136b and master hold output line 138b. Scan into master output line 136b and master hold control line 138b make up test input control bus 52, which electrically couples the routing module 228 to logic block 30b. First set AND gate 208c and second set AND gate 210c are electrically coupled to logic block 30c by scan into master output line 136c and master hold output line 138c. Scan into master output line 136c and master hold output line 138c make up the test input control bus 58, which electrically couples the routing module 228 to logic block 30c. First set AND gate 208d and second set AND gate 210d are electrically coupled to logic block 30d by scan into master output line 136d and master hold output line 138d. Scan into master output line 136d and master hold output line 138d make up test input control bus 64, which electrically couples the routing module 228 to logic block 30d. The exemplary embodiment includes logic blocks 30a–30d. However, other embodiments include more logic blocks, and the first and second set AND gates 208a–208n and 210a–210n direct or gate control signals to them also.

Multiplexer sets 204a–204n are made up of two to one multiplexers in parallel and are similar to multiplexer sets 104a–104n, previously described. Each multiplexer in a multiplexer set 204a–204n is a two to one multiplexer having a zero input, a one input, a select input and a single output. The multiplexers are electrically coupled at one input to a test vector input line and at the other input to a test vector output line. All select inputs in a multiplexer set 204a–204n are electrically coupled together. A binary value on the select inputs directs all zero inputs or all one inputs to the outputs. The multiplexer sets 204a–204n are arranged in a series with the outputs of one multiplexer set 204a–204n electrically coupled to zero inputs of the next multiplexer set 204b–204n.

The multiplexer set 207 is also a set of two to one multiplexers arranged in parallel and similar to multiplexer sets 204a–204n. Each multiplexer in multiplexer set 207 is a two to one multiplexer having a zero input, a one input, a select input and a single output. The multiplexers are electrically coupled at the zero inputs and one inputs to test vector lines. All select inputs in multiplexer set 207 are electrically coupled together. A binary value on the select inputs directs all zero inputs or all one inputs to the outputs. The outputs of multiplexer set 207 are electrically coupled to test vector output bus 44.

Multiplexer set 204a is electrically coupled to input logic 36 and input circuits 22 through test vector input bus 42. Test vector input bus 42 is made up of test vector input lines 42a–42n, which electrically couple routing module 228 to input logic 36. Test vector input bus 42 is electrically coupled to the zero inputs of multiplexer set 204a and also test vector input bus 48. Test vector input bus 48 is made up of test vector input lines 48a–48n, which electrically coupled routing module 228 to the inputs of scan chains 34 in logic block 30a. The outputs of scan chains 34 in logic block 30a are electrically coupled to the one inputs of multiplexer set 204a and the EXCLUSIVE-OR set 205 through test vector output bus 50. Test vector output bus 50 is made up of test vector output lines 50a–50n.

Multiplexer set 204b is electrically coupled to multiplexer set 204a through multiplexer output bus 220. Multiplexer output bus 220 is electrically coupled to the zero inputs of multiplexer set 204b and also to test vector input bus 54. Test vector input bus 54 is made up of test vector input lines 54a–54n, which electrically couple the routing module 228 to the inputs of scan chains 34 in logic block 30b. The outputs of scan chains 34 in logic block 30b are electrically coupled to the one inputs of multiplexer set 204b and the EXCLUSIVE-OR gate set 205 over test vector output bus 56. Test vector output bus 56 is made up of test vector output lines 56a–56n.

Multiplexer set 204c is electrically coupled to the outputs of multiplexer set 204b through multiplexer output bus 222. Multiplexer output bus 222 is electrically coupled to the zero inputs of multiplexer set 204c and also to test vector input bus 60. Test vector input lines 60a–60n make up test vector input bus 60 and electrically couple the routing module 228 to the input of scan chains 34 in logic block 30c. The outputs of scan chains 34 and logic block 30c are electrically coupled to the one inputs of multiplexer set 204c and the EXCLUSIVE-OR gate set 205 through test vector output bus 62, which is made up of test vector output lines 62a–62n.

Multiplexer set 204d is electrically coupled to the outputs of multiplexer set 204c through multiplexer output bus 224. Multiplexer output bus 224 is electrically coupled to the zero inputs of multiplexer set 204d and to the test vector input bus 66. Test vector input lines 66a–66n make up the test vector input bus 66 and electrically couple the routing module 228 to the inputs of scan chains 34 in logic block 30d. The outputs of scan chains 34 in logic block 30d are electrically coupled to the one inputs of multiplexer set 204d, and to the EXCLUSIVE-OR gate set 205 through test vector output bus 68, which is made up of test vector output line 68a–68n. The multiplexer output bus 226 is electrically coupled to the outputs of multiplexer set 204d and the zero inputs of the next multiplexer set 204e. The multiplexer sets 204e–204n are connected in series with the outputs of a previous set electrically coupled to the zero inputs of the next set.

Multiplexer set 207 is electrically coupled to the EXCLUSIVE-OR gate set 205 and multiplexer set 204n. The outputs of multiplexer set 204n are electrically coupled to zero inputs of multiplexer set 207 through multiplexer output bus 230. The outputs of the EXCLUSIVE-OR gate set 205 are electrically coupled to the one inputs of multiplexer set 207 through EXCLUSIVE-OR bus 232. The outputs of multiplexer set 207 are electrically coupled to output logic 38 and output circuits 24 through test vector output bus 44, which is made up of test vector output lines 44a–44n. The test vector output lines 44a–44n electrically couple routing module 228 to output logic 38 and output circuits 24.

Routing module 228 is configured for testing integrated circuit 20 in three ways. In one test, a series of logic blocks 30a–30d are tested with the outputs of one logic block 30a–30d electrically coupled to the inputs of the next logic block 30a–30d. In a second test, each logic block 30a–30d is tested independently. In a third test, all logic blocks 30a–30d are tested in parallel. Tests one and two are similar to tests previously described. The third test is different.

In the third test, all logic blocks 30a–30d receive the same test input vectors and retain at least a subset of these test input vectors. Next, the integrated circuit 20 is switched to normal mode and clocked in normal operation. Next, the integrated circuit 20 is put into test mode and test output vectors are shifted out of scan chains 34 through EXCLUSIVE-OR gate set 205 in parallel. This results in a set of test output vectors, which are checked to verify proper operation of storage elements 32 and combinational logic in all logic blocks 30a–30d.

In the first test, integrated circuit 20 is put into test mode and a binary zero is provided at decoder inputs 212 to select decoder output 214a. The binary zero is provided to decoder inputs 212 through input circuits 22, input logic 36 and test input configuration bus 130. Decoder output 214a goes high and the rest of the decoder outputs 214b–214p are low. Decoder output 214a provides a high logic level to all first set OR gates 206a–206n, which sets the outputs of all first set OR gates 206a–206n to a high level. A high level on all first set OR gates 206a–206n selects all one inputs of multiplexer sets 204a–204n, and also sets all outputs of second set OR gates 209a–209n to a high level. The high outputs of the second set OR gates 209a–209n set one input of all first set AND gates 208a–208n and one input of all second set AND gates 210a–210n to a high level. This gates the scan into master signal and master hold signal through the routing module 228 to all logic blocks 30a–30d.

In this test, multiplexer sets 204a–204n direct the one inputs to multiplexer outputs to couple the outputs of one logic block 30a–30d to the inputs of the next logic block 30a–30d. Test input vectors are provided to the routing module 228 through input circuits 22 and input logic 36 over test vector input bus 42. The test input vectors are routed to logic block 30a through test vector input bus 42 and test vector input bus 48. Test vector output bus 50 from logic block 30a is electrically coupled through multiplexer set 204a to test vector input bus 54 of logic block 30b. Test vector output bus 56 of logic block 30b is electrically coupled to test vector input bus 60 of logic block 30c through multiplexer set 204b. Test vector output bus 62 of logic block 30c is electrically coupled to test vector input bus 66 of logic block 30d through multiplexer set 204c, and test vector output bus 68 from logic block 30d is electrically coupled through multiplexer sets 204d–204n to multiplexer output bus 230. In the exemplary embodiment, multiplexer sets 204e–204n are not connected to any logic blocks and the select inputs are all grounded or held low. In another embodiment, any or all multiplexer sets 204e–204n can be electrically coupled to logic blocks, with their select inputs electrically coupled to OR gates 206e–206n and routing module 228 can be expanded to accommodate larger integrated circuits.

Multiplexer set 207 is electrically coupled to output logic 38 and output circuits 24 through test vector output bus 44. The decoder output 214p is not selected and therefore low, which selects the zero inputs of multiplexer set 207. The zero inputs provided through the multiplexer output bus 230 are directed to the outputs of multiplexer set 207 and the test vector output bus 44.

In operation, test input vectors are provided on test vector input bus 42 and shifted into logic blocks 30a–30d in series. Scan chains 34 in all logic blocks 30a–30d are loaded by shifting the test input vectors through the logic blocks 30a–30d in series. The storage elements 32 are shifted as previously described by toggling the scan into master control line 132 and a master to scan output signal, while holding the master hold control line 134 high. After the storage elements 32 in scan chains 34 in logic blocks 30a–30d are loaded with test input vectors, the integrated circuit 20 is switched to normal mode for normal operation.

In normal mode, the system clock is toggled one or more times to acquire data from the storage elements 32 and combinational logic in the logic blocks 30a–30d. After clocking the system clock in normal mode, the integrated circuit 20 is switched back to test mode.

In test mode, the binary zero is provided to the decoder inputs 212 and the test output vector is shifted out of storage elements 32 and scan chains 34 in logic blocks 30a–30d in series. The test output vector is shifted through multiplexer set 207 to output logic 38 and output circuits 24 over test vector output bus 44. The test output vector is checked against expected values to determine whether or not storage elements 32 and combinational logic in logic blocks 30a–30d are functioning properly. As the test output vector is shifted out of scan chains 34, a new test input vector is shifted in. The process continues until the test vector set is exhausted. In this test, the operation between logic blocks 30a–30d can be test with a reduced test vector set.

In the second test, each logic block 30a–30d is tested independently. A binary value greater than zero is provided to decoder inputs 212 through test input configuration bus 130. The binary value selects one logic block 30a–30d for testing. The binary value is chosen to select one decoder output 214b–214o, excluding decoder outputs 214a and 214p. The selected decoder output 214b–214o is set high, which sets one first set OR gate 206a–206n high. The high first set OR gate 206a–206n sets one second set OR gate 209a–209n high, and also selects the one inputs of one multiplexer set 204a–204n. Selecting the one inputs of one multiplexer set 204a–204n, selects the outputs from the selected logic block 30a–30d. The high second set OR gate 209a–209n sets one input high on a first set AND gate 208a–208n and one input high on a second set AND gate 210a–210n. This gates the scan into master control signal and master hold control signal through the selected AND gates 208a–208n and 210a–210n to the selected logic block 30a–30d.

In operation, a test input vector is provided to test vector input bus 42 and multiplexer sets 204a–204n. The test input vector propagate through the zero inputs of multiplexer sets 204a–204n until it reaches the multiplexer set 204a–204n, which has a high level on it's input select line. At this selected multiplexer set 204a–204n, the test input vector is prevented from further propagating through the multiplexer sets 204a–204n. The test input vector is shifted into storage elements 32 and scan chains 34 of the selected logic block 30a–30d.

Next, the integrated circuit 20 is switched to normal mode and the system clock is toggled in normal operation. The acquired data is stored in storage elements 32 and the integrated circuit 20 is switched back to test mode.

In test mode, the acquired data or test output vector is shifted out of the selected logic block 30a–30d and through the one inputs of the selected multiplexer set 204a–204n. The test output vector propagates through the zero inputs of non-selected multiplexer sets 204a–204n to zero inputs of multiplexer set 207. Decoder output 214p is low, which selects the zero inputs of multiplexer set 207. The test vector output signals on the zero inputs of multiplexer set 207 are provided to test vector output bus 44 and output circuits 24. The test output vector is checked against expected values to verify proper operation of storage elements 32 and combinational logic in the selected logic block 30a–30d. As the test output vector is shifted out of the selected logic block 30a–30d, a new test input vector is shifted into the selected logic block 30a–30d. The process continues until all test vectors for the selected logic block 30a–30d are exhausted. In this manner, logic blocks 30a–30d are independently tested, regardless of functionality and with a minimal number of vectors. Fault coverage from this type of testing can be greater than 90%.

In a third test, a binary value is provided to decoder inputs 212 to select decoder output 214p and set it high. All other decoder outputs 214a–214o are low. The high decoder output 214p sets all second set OR gates 209a–209n high, and selects the one inputs for multiplexer set 207. The high second set OR gates 209a–209n direct or gate the scan into master control signal and the master hold control signal to all logic blocks 30a–30d. With decoder outputs 214a–214o low, the first set OR gates 206a–206n all have low outputs. This selects the zero inputs for multiplexer sets 204a–204n. A test input vector provided on test vector input bus 42 propagates through the multiplexer sets 204a–204n and is provided at the inputs of all logic blocks 30a–30d.

In operation, the integrated circuit 20 is first put into test mode and a test input vector is provided through test vector input bus 42. The test input vector propagates through the zero inputs of the multiplexer sets 204a–204n to test vector input buses 48, 54, 60 and 66 for logic blocks 30a–30d. All logic blocks 30a–30d receive the same test input vector. The test input vector is long enough to fill the longest scan chain 34 in logic blocks 30a–30d. In shorter scan chains 34, only the latter test input vector values are retained in scan chains 34. The test input vector is shifted into the scan chains 34 in all logic blocks 30a–30d in parallel. Scan into master control signals and master hold control signals are provided through the routing module 228 and the first and second set of AND gates 208a–208n and 210a–210n to all logic blocks 30a–30d in parallel. After shifting the test input vector into the scan chains 34, the integrated circuit 20 is switched into normal mode.

In normal mode, the system clock is toggled one or more times in normal operation. This provides data about storage elements 32 and combinational logic in logic blocks 30a–30d. After the system clock has been toggled, the integrated circuit 20 is switched back into test mode.

In test mode, the binary value is provided to select decoder output 214p, which selects the one inputs of multiplexer set 207. The zero inputs are selected on multiplexer sets 204a–204n. The test output vector data stored in the storage elements 32 of logic blocks 30a–30d is shifted out of the scan chains 34 in parallel to test vector output buses 50, 56, 62 and 68. The test vector output buses 50, 56, 62 and 68 are electrically coupled to EXCLUSIVE-OR gate set 205. The test output vectors from logic blocks 30a–30d propagate through the EXCLUSIVE-OR gate set 205 in parallel to the EXCLUSIVE-OR output bus 232. The one inputs of multiplexer set 207 are selected, which provides the EXCLUSIVE-OR output bus 232 and the EXCLUSIVE-OR output signals to test vector output bus 44 and output circuits 24. The EXCLUSIVE-OR test output signals or vector are checked against expected values to determine if the storage elements 32 and combinational logic in logic blocks 30a–30d are functioning properly. As the test output vector is shifted out of scan chains 34, a new test input vector is shifted into scan chains 34. The process continues until all test vectors are exhausted.

The third test technique is referred to as folding. In folding, the test output signals from multiple logic blocks 30a–30d are combined through a folding circuit. The folding circuit can be any suitable logic. In the exemplary embodiment, the folding circuit is EXCLUSIVE-OR gate set 205. By directing the test output vectors from all logic blocks 30a–30d through logic, such as an EXCLUSIVE-OR gate set 205, the number of test vectors needed for testing the logic blocks 30a–30d is reduced. This technique also increases fault coverage while reducing test vector number. Reducing the number of test vectors reduces test time and the cost of the integrated circuit 20. The logic provided for folding the test output vectors together is not limited to an EXCLUSIVE-OR arrangement. In other embodiments, a different logic function or functions can be provided to combine the test output vectors from all logic blocks or a subset of logic blocks 30a–30d.

In one embodiment, the test vectors for testing individual logic blocks are generated first. Next, the test vectors for folding are generated, and then the test vectors for testing the logic blocks in series are generated. Fault coverage provided by first generating the test vectors for testing individual logic blocks is in the 70–90% range. Folding increases the fault coverage to about 93–94%, and series testing increases the fault coverage further, to greater than 95%. The individual, folding and series logic block tests can be performed in any order.

Figure 5:
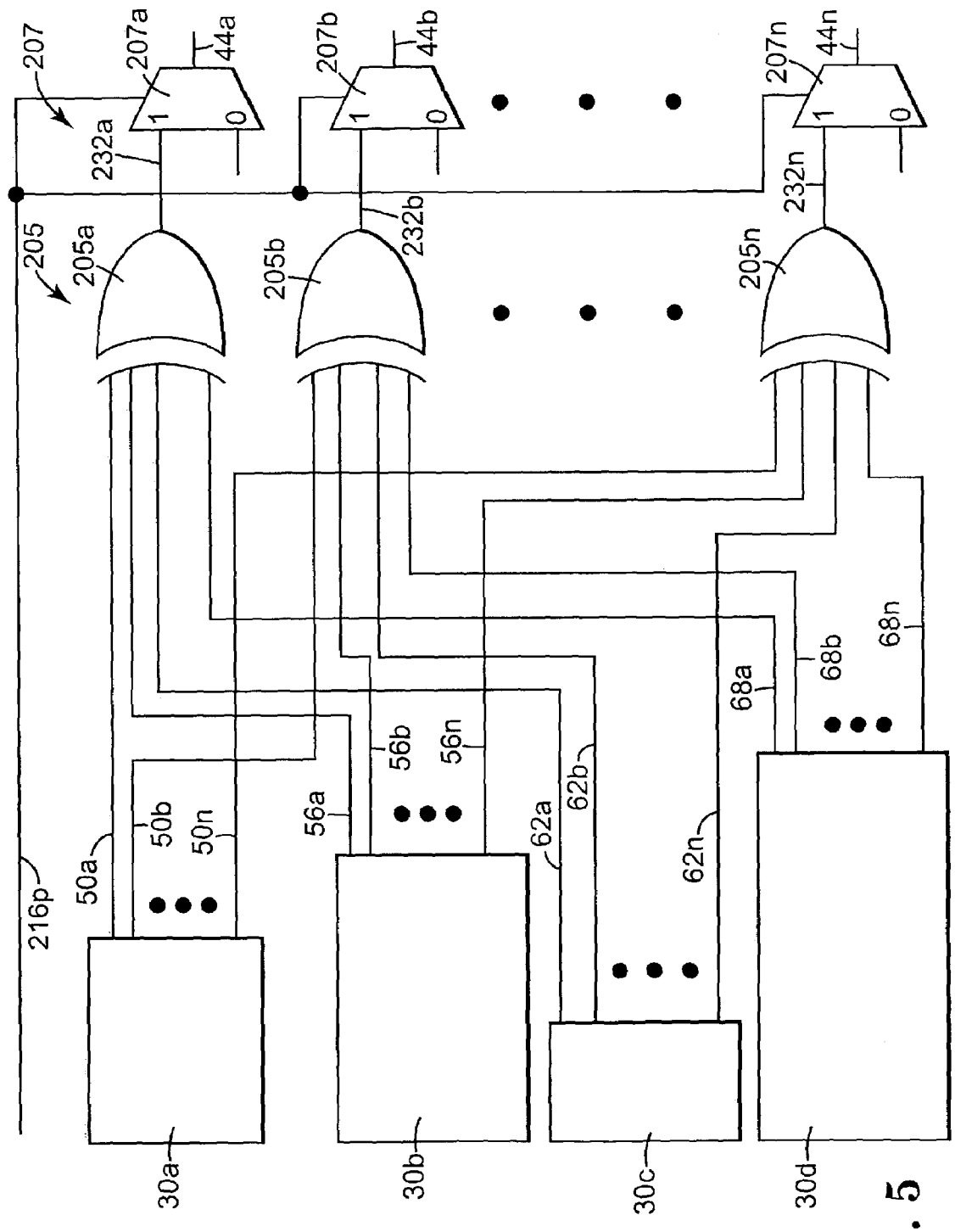
FIG. 5 is a diagram illustrating an exemplary embodiment of an Exclusive-Or gate set.

FIG. 5 is a diagram illustrating an exemplary embodiment of EXCLUSIVE-OR gate set 205. The EXCLUSIVE-OR gate set 205 includes EXCLUSIVE-OR gates 205a–205n electrically coupled to logic blocks 30a–30d. Multiplexer set 207 includes multiplexers 207a–207n electrically coupled to the outputs of EXCLUSIVE-OR gates 205a–205n.

Logic blocks 30a–30d are electrically coupled to test vector output lines. Logic block 30a is electrically coupled to test vector output lines 50a–50n. Logic block 30b is electrically coupled to test vector output lines 56a–56n. Logic block 30c is electrically coupled to test vector output lines 62a–62n, and logic block 30d is electrically coupled to test vector output lines 68a–68n.

Test vector output lines with similar letter subscripts are attached to the same EXCLUSIVE-OR gate 205a–205n. EXCLUSIVE-OR gate 205a is electrically coupled to test vector output lines 50a, 56a, 62a and 68a. EXCLUSIVE-OR gate 205b is electrically coupled to test vector output lines 50b, 56b, 62band 68b. The EXCLUSIVE-OR gates 205a–205n are electrically coupled to logic blocks 30a–30d in this manner up to and including EXCLUSIVE-OR gate 205n, which is electrically coupled to test vector output lines 50n, 56n, 62n and 68n.

The EXCLUSIVE-OR gates 205a–205n each include an output electrically coupled to the one input of a multiplexer 207a–207n. EXCLUSIVE-OR gate 205a is electrically coupled to the one input of multiplexer 207a through EXCLUSIVE-OR output line 232a. EXCLUSIVE-OR gate 205b is electrically coupled to the one input of multiplexer 207b through EXCLUSIVE-OR output line 232b. The EXCLUSIVE-OR gates 205 are electrically coupled to the multiplexers 207 in this manner up to and including EXCLUSIVE-OR gate 205n, which is electrically coupled to multiplexer 207n through EXCLUSIVE-OR output line 232n. The EXCLUSIVE-OR output lines 232a–232n make up the EXCLUSIVE-OR output bus 232.

Multiplexers 207a–207n are electrically coupled to test vector output bus 44 and output circuits 24. Decoder output 214p is electrically coupled to the select inputs on multiplexers 207a–207n through decoder output line 216p. The output of multiplexer 207a is electrically coupled to test vector output line 44a. The output of multiplexer 207b is electrically coupled to test vector output line 44b and so on up to multiplexer 207n, which is electrically coupled to test vector output line 44n. Test vector output lines 44a–44n make up test vector output bus 44.

In operation, the test output vectors on test vector output lines with similar letter subscripts are combined through an EXCLUSIVE-OR gate 205a–205n to obtain a combined result. For example, EXCLUSIVE-OR gate 205a combines test output vectors on test vector output lines 50a, 56a, 62a and 68a. The result is provided on the output of EXCLUSIVE-OR gate 205a to the one input of multiplexer 207a and test vector output line 44a. Each EXCLUSIVE-OR gate 205a–205n provides a combined result to test vector output bus 44 for each shift of scan chains 34. The results from EXCLUSIVE-OR gate set 205 are provided to output logic 38 and output circuits 24 through test vector output bus 44.

These tests reduce test vector length and the number of test vectors needed for testing the integrated circuit 20. The scan chains 34 through integrated circuit 20 are made smaller by dividing the integrated circuit 20 into logic blocks, such as logic blocks 30a–30d. Each of these logic blocks 30a–30d can be tested individually, without regard to the functionality of the logic block 30a–30d or the overall functionality of the integrated circuit 20. Testing individual logic blocks 30a–30d and testing without regard to functionality makes it easier to produce test vectors, which reduces development time. Testing logic blocks 30a–30d in series, improves fault coverage and reduces the number of test vectors. Testing logic blocks 30a–30d in parallel, improves fault coverage and reduces the number of test vectors needed for good fault coverage, such as greater than 95%. Good fault coverage ensures quality integrated circuits 20. Reducing test vector length and the number of test vectors, reduces test times and the cost of the integrated circuit 20.

In addition, by disabling or switching off the shifting of non-selected scan chains 34 during scan testing, power consumption and noise levels are reduced, which increases voltage margins during scan testing. Increased voltage margins make it easier to test the integrated circuit 20 at low voltage source values.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiments shown and described without departing from the scope of the present invention. Those with skill in the chemical, mechanical, electromechanical, electrical, and computer arts will readily appreciate that the present invention may be implemented in a very wide variety of embodiments. This application is intended to cover any adaptations or variations of the preferred embodiments discussed herein. Therefore, it is manifestly intended that this invention be limited only by the claims and the equivalents thereof.

What is claimed is:

1. An integrated circuit, comprising:
   logic blocks;
   multiple routing configurations including a series routine configuration that routes test input vectors to one logic block in a series of logic blocks via another logic block in the series of logic blocks, a parallel routing configuration that routes the test input vectors to multiple logic blocks in parallel, and an individual routing configuration that routes the test input vectors to individual logic blocks; and a routing module configured to receive the test input vectors and comprising:

a circuit configured to select at least one logic block, select each routing configuration of the multiple routing configurations, and route the test input vectors to the at least one selected logic block and provide test output vectors according to the selected routing configuration, where each time the circuit selects one routing configuration of the multiple routing configurations the circuit deselects the other routing configurations of the multiple routing configurations.

2. The integrated circuit of claim 1, where the circuit comprises selection logic configured to provide test control signals to the at least one selected logic block and switch off the test control signals to non-selected logic blocks to reduce power consumption and noise levels during testing.

3. The integrated circuit of claim 1, where the circuit is configured to route the test input vectors to the series of logic blocks and to electrically couple logic blocks in the series of logic blocks, where test outputs from one logic block in the series of logic blocks are electrically coupled to test inputs of a next logic block in the series of logic blocks via the circuit.

4. The integrated circuit of claim 1, where the circuit is configured to route the test input vectors to the series of logic blocks and the circuit routes test control signals to all logic blocks in the series of logic blocks.

5. The integrated circuit of claim 1, where the circuit is configured to route the test input vectors to multiple logic blocks in parallel and to route test outputs of the multiple logic blocks through a folding circuit to provide the test output vectors.

6. The integrated circuit of claim 1, where the circuit is configured to route the test input vectors to multiple logic blocks in parallel and to route test outputs of the multiple logic blocks through exclusive-or logic to provide the test output vectors.

7. The integrated circuit of claim 1, where the circuit comprises a decoder that receives test configuration data to route test signals to the logic blocks and provide the test output vectors.

8. The integrated circuit of claim 1, where the circuit comprises a decoder and selection logic electrically coupled to the decoder, where the decoder and the selection logic combine to select logic blocks and route test signals to the selected logic blocks.

9. The integrated circuit of claim 1, where the circuit comprises:
a decoder;
selection logic electrically coupled to the decoder; and
multiplexers controlled by the decoder and the selection logic to route test signals to the logic blocks.

10. A testing mechanism in an integrated circuit, comprising:
scan storage elements combined to form scan chains in logic blocks;
multiple routing configurations including a series routing configuration that routes test input vectors to one logic block in a series of logic blocks via another logic block in the series of logic blocks, a parallel routing configuration that routes the test input vectors to multiple logic blocks in parallel, and an individual routing configuration that routes the test input vectors to individual logic blocks; and a routing module configured to receive test configuration signals and comprising:

a circuit configured to select at least one logic block and each routing configuration of the multiple routing configurations based on the test configuration signals, where each time the circuit selects one routing configuration of the multiple routing configurations the circuit deselects the other routing configurations of the multiple routing configuration.

11. The testing mechanism of claim 10, where the circuit is configured to provide test output vectors from the at least one selected logic block.

12. The testing mechanism of claim 10, where the circuit is configured to route the test input vectors to one selected logic block and provide test output vectors from the one selected logic block.

13. The testing mechanism of claim 10, where the circuit is configured to route the test input vectors to a first logic block in a series of logic blocks and test control signals to all logic blocks in the series of logic blocks, where scan chain outputs from one logic block in the series of logic blocks are electrically coupled to scan chain inputs of a next logic block in the series of logic blocks through the circuit.

14. The testing mechanism of claim 10, where the circuit is configured to route the test input vectors to selected logic blocks in parallel and to route scan chain outputs of the selected logic blocks through logic to provide test output vectors.

15. A method of testing an integrated circuit, comprising:
receiving test input vectors;
selecting at least one logic block;
selecting each routing configuration of multiple routing configurations including a series routing configuration that routes the test input vectors to one logic block in a series of logic blocks via another logic block in the series of logic blocks, a parallel routing configuration that routes the test input vectors to multiple logic blocks in parallel, and an individual routing configuration that routes the test input vectors to individual logic blocks to provide greater fault coverage;
deselecting the other routing configurations of the multiple routing configurations each time one routing configuration of the multiple routing configurations is selected;
routing the test input vectors to the at least one selected logic block; and
providing test output vectors according to the selected routing configurations.

16. The method of claim 15 comprising:
providing test control signals to the at least one selected logic block; and
switching off the test control signals to non-selected logic block.

17. The method of claim 16, where routing the test input vectors comprises routing the test input vectors to logic blocks in parallel, and providing test output vectors comprises routing test outputs of the selected logic blocks through a folding circuit.

* * * * *

UNITED STATES PATENT AND TRADEMARK OFFICE
CERTIFICATE OF CORRECTION

PATENT NO. : 7,219,280 B2  Page 1 of 1
APPLICATION NO. : 10/373388
DATED : May 15, 2007
INVENTOR(S) : Walter McNall It is certified that error appears in the above-identified patent and that said Letters Patent is hereby corrected as shown below:

Col. 20 Line 66 In Claim 1, delete "routine" and insert -- routing --, therefor.

Col. 22 Line 11 In Claim 10, delete "muting" and insert -- routing --, therefor.

Col. 22 Line 14 In Claim 10, delete "configuration." and insert -- configurations. --, therefor.

Col. 22 Line 60 In Claim 17, after "claim" delete "16," and insert -- 15, --, therefor.

Signed and Sealed this

Sixteenth Day of December, 2008

JON W. DUDAS
*Director of the United States Patent and Trademark Office*